United States Patent
Liu et al.

(10) Patent No.: US 10,490,757 B2
(45) Date of Patent: Nov. 26, 2019

(54) FLEXIBLE DISPLAY PANEL, FABRICATION METHOD, AND FLEXIBLE DISPLAY APPARATUS

(71) Applicants: Shanghai Tianma Micro-Electronics Co., Ltd., Shanghai (CN); Tianma Micro-Electronics Co., Ltd., Shenzhen (CN)

(72) Inventors: Conghui Liu, Shanghai (CN); Heeyol Lee, Xiamen (CN); Quanpeng Yu, Shanghai (CN)

(73) Assignees: SHANGHAI TIANMA MICRO-ELECTRONICS CO., LTD., Shanghai (CN); TIANMA MICRO-ELECTRONICS CO., LTD., Shenzhen (CN)

(*) Notice: Subject to any disclaimer, the term of this patent is extended or adjusted under 35 U.S.C. 154(b) by 339 days.

(21) Appl. No.: 15/484,234

(22) Filed: Apr. 11, 2017

(65) Prior Publication Data
US 2017/0222165 A1    Aug. 3, 2017

(30) Foreign Application Priority Data
Nov. 4, 2016    (CN) .......................... 2016 1 0972371

(51) Int. Cl.
| | | |
|---|---|---|
| *H01L 51/00* | (2006.01) | |
| *H01L 51/52* | (2006.01) | |
| *G02F 1/1333* | (2006.01) | |
| *G02B 1/14* | (2015.01) | |
| *G02B 1/18* | (2015.01) | |

(52) U.S. Cl.
CPC ............ *H01L 51/0097* (2013.01); *G02B 1/14* (2015.01); *G02B 1/18* (2015.01); *G02F 1/133305* (2013.01); *H01L 51/5253* (2013.01)

(58) Field of Classification Search
CPC . H01L 51/0097; H01L 51/52; H01L 51/5253; H01L 2251/5338; H01L 51/56; G02B 1/18; G02B 1/14; G02F 1/133305; Y02P 70/521; Y02E 10/549
USPC .................... 359/296; 174/254, 250; 257/40
See application file for complete search history.

(56) References Cited

U.S. PATENT DOCUMENTS

2016/0336532 A1* 11/2016 Li .................... H01L 25/167
2018/0212167 A1*  7/2018 Chun ................. H01L 51/52

FOREIGN PATENT DOCUMENTS

| CN | 101398555 A | 4/2009 |
|---|---|---|
| CN | 103247233 A | 8/2013 |
| CN | 104659039 A | 5/2015 |
| CN | 104885140 A | 9/2015 |
| CN | 105161512 A | 12/2015 |
| CN | 205657057 U | 10/2016 |

* cited by examiner

*Primary Examiner* — Tuyen Tra
(74) *Attorney, Agent, or Firm* — Anova Law Group PLLC (57) ABSTRACT

A flexible display panel and a fabrication method for a flexible display panel are provided. The flexible display panel comprises a flexible substrate having a display area and a step area adjacent to the display area, a display device disposed on a top surface of the flexible substrate and in the display area, a bottom protective film disposed on a bottom surface of the flexible substrate, and a plurality of through-holes disposed in the step area and penetrating the flexible substrate.

18 Claims, 9 Drawing Sheets

FLEXIBLE DISPLAY PANEL, FABRICATION METHOD, AND FLEXIBLE DISPLAY APPARATUS

CROSS-REFERENCES TO RELATED APPLICATIONS

This application claims the priority of Chinese Patent Application No. CN201610972371.5, filed on Nov. 4, 2016, the entire contents of which are incorporated herein by reference.

FIELD OF THE DISCLOSURE

The present disclosure generally relates to the display technology and, more particularly, relates to a flexible display panel, a fabrication method thereof, and a flexible display apparatus.

BACKGROUND

A flexible display panel is a display device that is deformable and bendable. The flexible display panel often includes an e-paper, a liquid crystal display (LCD) device, and an organic light-emitting diode (OLED) display device, etc. Flexible OLED display panels featured with low power consumption, thin cell gap of the display panel, and rollable capability have attracted a lot of attention. The flexible OLED display panel often includes a flexible substrate, an OLED display device, and lead lines connecting the OLED display device. The OLED display device includes an anode, a cathode configured facing toward the anode, and a function layer disposed between the anode and the cathode. In the OLED display, when organic light-emitting materials and semiconductor materials are driven by the electric field generated between the cathode and the anode, light emission is generated by the carrier injection and recombination.

To maintain the life span of the OLED display device, the OLED display device often requires a packaging or an encapsulation and a protective film attached to the OLED display device, thereby protecting the OLED display device from moisture and oxygen. However, when the protective film is attached to the flexible substrate, bubbles may be generated, degrading the appearance and viewing experience of the flexible OLED display panel. When the bubbles are located in the position of the lead lines, the lead lines may be bumped out, causing damages to the lead lines.

The disclosed flexible display panel, fabrication method thereof, and flexible display apparatus are directed to solve one or more problems set forth above and other problems.

BRIEF SUMMARY OF THE DISCLOSURE

One aspect of the present disclosure provides a flexible substrate having a display area and a step area adjacent to the display area, a display device disposed on a top surface of the flexible substrate and in the display area, a bottom protective film disposed on a bottom surface of the flexible substrate, and a plurality of through-holes disposed in the step area and penetrating the flexible substrate.

Another aspect of the present disclosure provides a fabrication method for the flexible display panel. The fabrication method comprises providing a flexible substrate having a display area and a step area located adjacent to the display area, forming a display device in the display area disposed on a top surface of the flexible substrate, forming a thin film encapsulation layer on the display device, forming a plurality of through-holes in the step area of the flexible substrate and penetrating the flexible substrate, attaching a bottom protective film to a bottom surface of the flexible substrate, performing a bubble removal process to discharge air trapped in bubbles between the flexible substrate and the bottom protective film through a through-hole, and forming the flexible display panel.

Another aspect of the present disclosure provides a flexible display apparatus including a disclosed flexible display panel.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts. It should be understood that the exemplary embodiments described herein are only intended to illustrate and explain the present invention and not to limit the present invention. In addition, it should also be noted that, for ease of description, only part, but not all, of the structures associated with the present invention are shown in the accompanying drawings. All other embodiments obtained by those skilled in the art without making creative work are within the scope of the present invention.

The present disclosure will now be described in detail with reference to the accompanying drawings. When illustrating the embodiments of the present disclosure, certain areas of the schematic views of the device structures may be disproportionally enlarged for the convenience of illustration. In addition, the three-dimensional sizes including the length, width, and depth should be included in the actual implementation of the present disclosure.

As described in the background, to maintain the life span of the OLED display device, the OLED display device often requires a packaging or an encapsulation and a protective film attached to the OLED display device, thereby protecting the OLED display device from moisture and oxygen. However, when the protective film is attached to the flexible substrate, bubbles may be generated, affecting the appearance and viewing experience of the flexible OLED display panel. When the bubbles are located in the position of the lead lines, the lead lines may be bumped out, causing damages to the lead lines.

Figure 1:
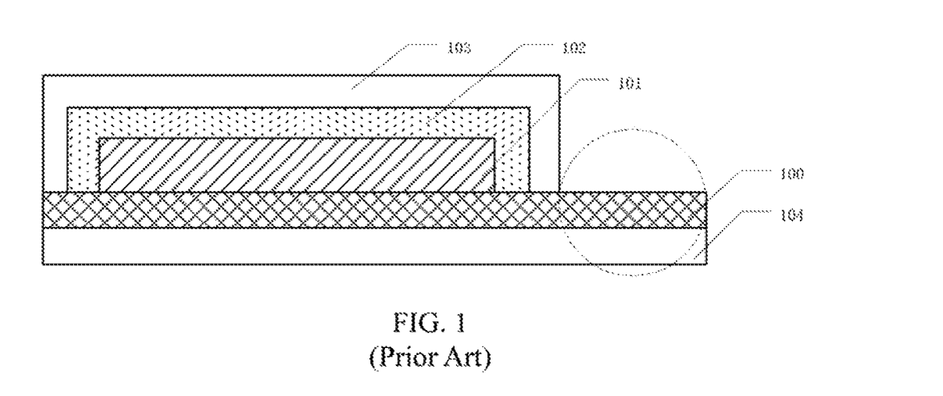
FIG. 1 illustrates a schematic view of an existing flexible OLED display panel.

When the protective film is attached to the flexible display panel, bubbles mainly occur at the bottom or the lower part of the flexible substrate, and are concentrated in a step area of the flexible substrate (as indicated by the dashed line in FIG. 1). The bubbles may affect the appearance of the flexible display panel, and may damage the lead lines connecting the flexible display panel.

FIG. 1 illustrates a schematic view of an existing flexible OLED display panel. A thin film encapsulation (TFE) and a protective film packaging are widely used in packaging flexible OLED display panel. Specifically, as shown in FIG. 1, an OLED display device 101 in a display area of a flexible substrate 100 is packaged by a thin film encapsulation layer 102. The flexible substrate has a first side facing the OLED display device 101 and an opposing side. Then, a top protective film 103 is attached to the OLED display device 101, and a bottom protective film 104 is attached to the opposing side of the flexible substrate. Thus, a complete protection to the flexible OLED display panel is realized.

As indicated by the dashed line in FIG. 1, the step area of the flexible substrate 100 is used to accommodate the lead lines for the OLED display device 101, and to bond the OLED display device 101. Because the step area is not easily flattened with the other portion of the flexible substrate 100, when the bottom protective film 104 is attached to the bottom surface (i.e., outer surface) of the flexible substrate 100, bubbles are likely to occur in the step area of the flexible substrate 100, degrading the appearance of the flexible display panel. When bumped up by the bubbles in the step area, the lead lines of the flexible display panel may easily be damaged. Thus, the presence of the bubbles in the step area seriously affects the overall quality of the flexible display panel.

The present disclosure provides a flexible display panel to eliminate the bubbles in the step area. The flexible display panel may include a flexible substrate having a display area and a step area disposed on a side of the display area, a display device disposed in the display area on a top surface of the flexible substrate, a bottom protective film attached to a bottom surface of the flexible substrate, and a plurality of through-holes disposed in the step area penetrating the flexible substrate.

The present disclosure also provides a fabrication method for the flexible display panel. The method may include providing a flexible substrate having a display area and a step area on a side of the display area, forming a display device on a top surface of the flexible substrate in the display area, forming a thin film encapsulation layer on top of the display device, forming a plurality of through-holes in the step area penetrating the flexible display panel, attaching a bottom protective film on a bottom surface of the flexible substrate, performing a bubble removal process to the bottom protective film to discharge the air trapped in the bubbles between the flexible substrate and the bottom protective film through the through-holes, and forming the flexible display panel.

In the disclosed flexible display panel and the fabrication method thereof, the through-holes penetrating the flexible display panel may be formed in the step area of the flexible display panel. Thus, the air trapped in the bubbles, which are generated when attaching the bottom protective film to the bottom surface of the flexible substrate, may be discharged through the through-holes during the bubble removal process. Thus, the problem of the bubbles in the step area in the existing technology may be resolved, the appearance degrading of the flexible display panel and the potential damages to the lead lines caused by the bubbles may be avoided, and the overall quality of the flexible display panel may be improved.

Figure 2:
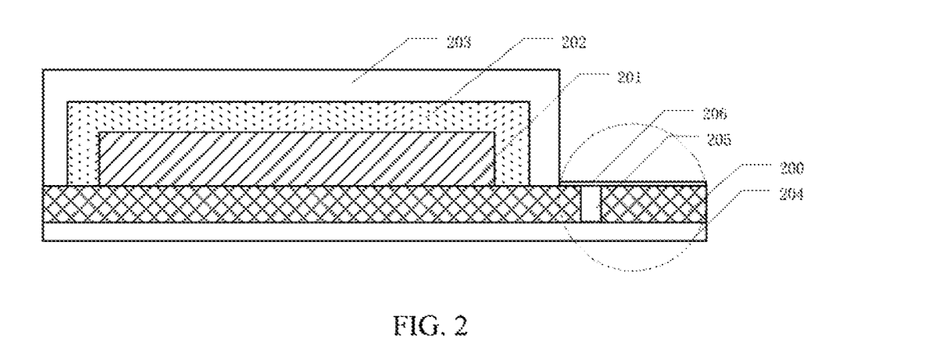
FIG. 2 illustrates a schematic view of an exemplary flexible display panel according to the disclosed embodiments.

FIG. 2 illustrates a schematic view of an exemplary flexible display panel according to the disclosed embodiments. As shown in FIG. 2, the flexible display panel may include a flexible substrate 200 having a display area and a step area (as indicated by the dashed line) disposed on a side of the display area, a display device 201 disposed on the top surface (i.e., inner surface) of the flexible substrate 200 in the display area, a bottom protective film disposed on the bottom surface (i.e., outer surface) of the flexible substrate 200, and a plurality of through-holes 205 disposed in the step area and penetrating the flexible substrate 200. The step area (as indicated by the dashed line) may not be disposed surrounding the display area.

The flexible substrate 200 may be made of various flexible materials according to various application scenarios, such as plastic, stainless steel, ultra-thin glass, paper, or bio-composite film. In one embodiment, the flexible substrate 200 may be made of plastic.

In particular, the flexible substrate 200 may include a display area and a step area located on a side of the display area. The display device 201 may be disposed in the display area of the flexible substrate 200, and the lead lines connecting the display device 201 may be disposed in the step area of the flexible substrate 200.

The display device 201 may be an organic light-emitting diode (OLED) display device, an electrophoretic display device, or any other appropriate display devices. In one embodiment, the display device 201 may be an OLED display device, and a corresponding structure is shown in FIG. 3.

Figure 3:
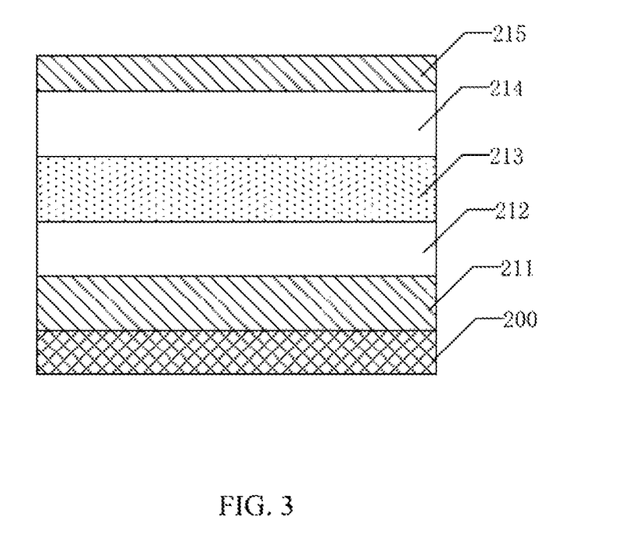
FIG. 3 illustrates a cross-sectional view of an exemplary display device in an exemplary flexible display panel according to the disclosed embodiments.

FIG. 3 illustrates a cross-sectional view of an exemplary display device in an exemplary flexible display panel according to the disclosed embodiments. As shown in FIG. 3, the display device 201 disposed on the flexible substrate 200 may include an anode layer 211, a first common layer 212, a light-emitting layer 213, a second common layer 214, and a cathode layer 215, which may be stacked to reach a certain height.

In the flexible display panel, to protect the display device 201 from moisture and oxygen penetration as well as the flexible substrate 200, a bottom protective film 204 may be disposed on the bottom surface of the flexible substrate 200. The bottom protective film 204 may be a high temperature resistant polyester film (PET film). To protect the display panel, the bottom protective film 204 may cover the entire bottom surface of the display panel.

As shown in FIG. 2, the display device 201 may be located on the top surface of the flexible substrate 200, and the bottom protective film may be located on the bottom surface of the flexible substrate 200. During the fabrication of the flexible display panel, the display device 201 may be often fabricated first, and then the bottom protective film 204 may be attached. Because the display device 201 has a certain height, the display area of the display panel may have a thickness greater than the step area.

When attaching the bottom protective film 204 to the bottom surface of the flexible substrate 200, due to the thickness difference between the display area of the display panel and the step area, the step area may not be easily flattened with the display area of the flexible substrate 200. Thus, bubbles are likely to occur in the step area of the flexible substrate 200, degrading the appearance of the flexible display panel.

To eliminate the bubbles, the through-holes 205 may be formed in the step area and penetrating the flexible substrate 200, thereby discharging the air trapped in the bubbles near the step area. Thus, the flexible display panel may be less affected by the bubbles generated in the step area.

Further, the flexible display panel may also include a thin film encapsulation layer 202 disposed on the display device 201, and a top protective film 203 disposed on the thin film encapsulation layer 202. The display device 201 may have a first side facing the flexible substrate 200 and an opposing side. The thin film encapsulation layer 202 may have a first side facing the display device 201 and an opposing side. The thin film encapsulation layer 202 may be disposed on the opposing side of the display device 201, and the top protective film 203 may be disposed on the opposing side of the thin film encapsulation layer 202.

The thin film encapsulation layer 202 may include a plurality of encapsulation thin films (e.g., organic and inorganic thin films) for sealing and packaging the display device 201. The thin film encapsulation layer 202 may cover the entire display device 201, including the side surfaces of the display device 201 to completely isolate the display device 201 from moisture and oxygen, thereby suppressing the moisture and oxygen penetration into the display device 201. The thin film encapsulation layer 202 may be formed by alternately overlapping a vacuum deposition polymer film and a high density dielectric layer, such that the mutual interference between the materials of different protective layers may be effectively eliminated.

Meanwhile, the top protective film 203 may be formed outside the thin film encapsulation layer 202 to further protect the display device 201 and avoid the moisture and oxygen penetration into the display device 201. Generally, the top protective film 203 may include a barrier film having a moisture and oxygen blocking function. Moreover, to fully protect the display device, the top protective film 203 may completely cover the thin film encapsulation layer 202, including the thin film encapsulation layer 202 on the side surfaces of the display device 201. However, the top protective film 203 may not cover the step area of the display panel.

The asymmetric film structure of the top protective film 203 and the bottom protective film 204 may effectively block the moisture and oxygen from entering the display device 201 by the moisture and oxygen blocking top protective film and, meanwhile, may expose the step area for the subsequent bonding process. On the other hand, the bottom protective film 204 may cover the entire display panel to protect the step area of the flexible substrate 200 (usually made of polyimides or PI) and to provide desired support to the flexible substrate 200.

Further, both the step area and the display area of the flexible substrate 200 may be fully protected to enhance the strength of the connection between the step area and the display area, and the strength of the step area of the flexible substrate 200. The enhancement may avoid the malfunction of the display panel due to the lead line damages caused by the broken substrate in the step area.

In the disclosed embodiments, a plurality of through-holes 205 may be formed in the step area of the flexible substrate 200 and penetrating the flexible substrate 200. The through-holes 205 may discharge the air trapped in the bubbles between the flexible substrate 200 and the bottom protective film 204. In particular, in the bubble removal process, the air trapped in the bubbles may be discharged through the through-holes 205 formed in the flexible substrate 200, such that the problem of the presence of the bubbles in the step area of the display panel may be resolved, and the quality and the production yield of the display panel may be improved.

In particular, the through-holes 205 may be formed by laser drilling. Further, the through-holes 205 may have a cross-section in circular, linear, square, oval, or polygonal shape. Further, the through-holes having sharp corners may be likely to cause cracks in the substrate. In one embodiment, the though-holes 205 may have a cross-section in circular shape. However, in another embodiment, the through-holes 205 may have a cross-section in other appropriate shapes according to various application scenarios.

Further, the plurality of through-holes 205 may be formed in the step area. The opening size of the through-holes 205 may be determined according to various application scenarios. In one embodiment, the through-holes 205 may have any one of the opening sizes smaller than or equal to about 1.5 mm. The opening size of the through-holes 205 may refer to a parameter capable of measuring the opening of the through-holes 205. For example, in the circular through-holes 205, the opening size may be the diameter of the circle. In the oval through-holes 205, the opening size may be the long axis or the minor axis of the ellipse. However, because the though-holes 205 is configured to have the opening size smaller than or equal to about 1.5 mm, the oval through-holes 205 may have both the long axis and the minor axis smaller than or equal to about 1.5 mm.

The reason that the opening size is limited to smaller than or equal to about 1.5 mm may be explained as follows. When attaching the bottom protective film 204 to the flexible substrate 200, the generated bubbles may have a maximum diameter of about 5 mm. Given the following thermodynamic formula:

$$\frac{P_1 V_1}{T_1} = \frac{P_2 V_2}{T_2}.$$

In the bubble removal process under about 50° C. and about 5 MPa, the bubbles having a diameter of about 5 mm at normal temperature and normal pressure may be split into smaller bubbles having a diameter of about 0.28 times the original diameter (i.e., a diameter of about 1.4 mm). Thus, when the opening size of the through-holes 205 is configured to be smaller than or equal to about 1.5 mm, the damage to the flexible substrate 200 due to an excessive through-hole size may be prevented, while the bubbles may be effectively discharged.

In one embodiment, when the through-hole 205 have the circular cross-section, the diameter of the through-holes 205 may be configured to be smaller than or equal to about 1.5 mm. In another embodiment, the through-hole 205 may have a cross-section in other shapes, such as oval shape. Thus, the long axis of the oval shape may be configured to be smaller than or equal to about 1.5 mm. Similarly, other cross-sectional shapes may have opening sizes smaller than or equal to about 1.5 mm.

Figure 4:
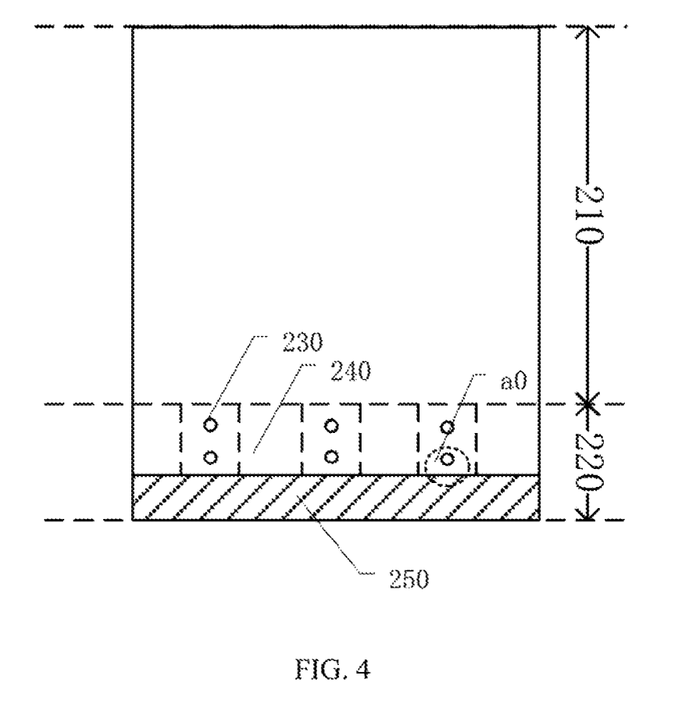
FIG. 4 illustrates a schematic view of an exemplary flexible substrate in an exemplary flexible display panel according to the disclosed embodiments.

Further, the flexible substrate 200 may be divided into different areas. A corresponding structure is shown in FIG. 4. FIG. 4 illustrates a schematic view of an exemplary flexible substrate in the flexible display panel according to the present disclosure.

As shown in FIG. 4, the flexible substrate 200 may include a display area 210 and a step area 220. The step area 210 may further include a plurality of through-hole sections 230 for drilling the through-holes 205, a plurality of lead line sections 240 for connecting the display device 201, and a bonding section 250 for bonding the lead lines. The step area 220 may have a first side adjacent to the display area 210 and an opposing side far away from the display area 210. The plurality of the through-hole sections 230 and the plurality of the lead line sections 240 may be disposed alternately along the first side of the step area 220. The bonding section 250 may be disposed on the opposing side of the step area 220. The lead line sections 240 may be connected to the bonding section 250.

During the fabrication of the flexible display panel, the lead lines may be formed before forming the through-holes 205. Through alternately disposing the through-hole sections 230 and the lead line sections 240, the through-holes 205 may be arranged to avoid the lead line positions, and any potential damages to the lead lines due to the drilling of the through-holes 205 may be suppressed. Meanwhile, the alternately disposed through-hole sections 230 and the lead line sections 240 may enable a substantially uniform distribution of the through-holes 205. Thus, the bubbles may be significantly suppressed or even eliminated.

In addition, when the bottom protective film 204 is attached to the flexible substrate 200, the bubbles often occur on the first side of the step area, i.e., the side adjacent to the display area. Thus, through disposing the through-hole sections 230 on the first side of the step area 220, the bubbles may be significantly suppressed or even eliminated. At least one through-hole 205 may be formed in each through-hole section 230. When more than one through-hole 205 are formed in any through-hole section 230, the through-holes 205 may be uniformly distributed in the through-hole section 230.

Because the bubbles between the bottom protective film 204 and the flexible substrate 200 are located in any position, the uniformly distributed through-holes 205 may have a greater probability to hit the bubbles to discharge the air trapped in the bubbles. As a result, the bubbles may be significantly suppressed or even eliminated. In one embodiment, as shown in FIG. 4, two through-holes 205 may be formed uniformly in each through-hole section 230, which is for illustrative purposes and is not intended to limit the scope of the present disclosure.

In another embodiment, the through-holes 205 may be disposed unevenly. The closer to the display area 210, the more likely the bubbles may occur. Thus, in the through-hole sections 230 in the step area 220, more through-holes 205 may be formed closer to the display area 210 and fewer through-holes 205 may be formed further away from the display area 210. That is, more through-holes 205 may be formed at the first side of the step area 220, while fewer through-holes 205 may be formed at the opposing side of the step area 220. Certain examples are shown in FIG. 5 and FIG. 6.

Figure 5:
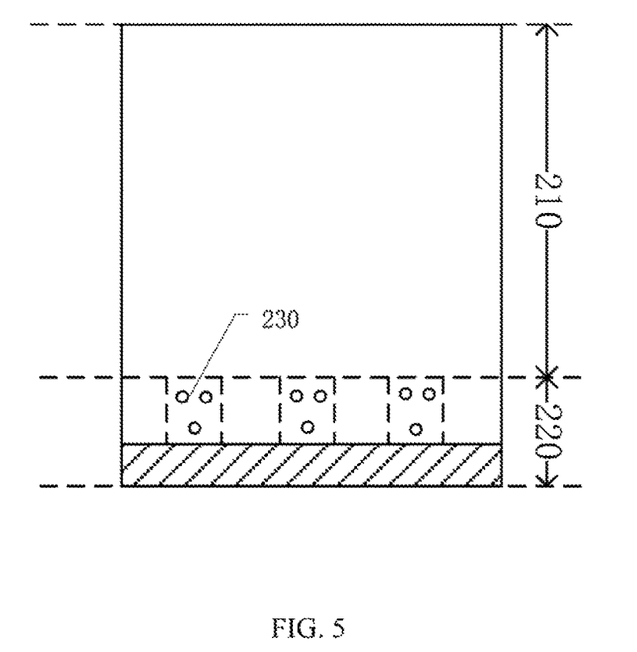
FIG. 5 illustrates a schematic view of an exemplary through-hole distribution in an exemplary flexible display panel according to the disclosed embodiments.

FIG. 5 illustrates a schematic view of an exemplary through-hole distribution in an exemplary flexible display panel according to the disclosed embodiments. As shown in FIG. 5, two through-holes 205 may be disposed in each through-hole section 230 adjacent to the display area 210, and only one through-hole 205 may be disposed in each through-hole section 230 away from the display area 210.

Figure 6:
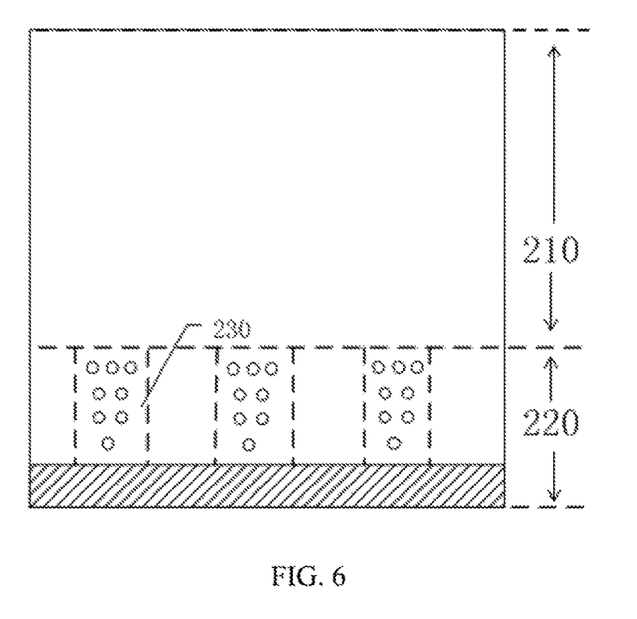
FIG. 6 illustrates a schematic view of another exemplary through-hole distribution in an exemplary flexible display panel according to the disclosed embodiments.

FIG. 6 illustrates a schematic view of another exemplary through-hole distribution in an exemplary flexible display panel according to the disclosed embodiments. As shown in FIG. 6, three through-holes 205 may be disposed in each through-hole section 230 adjacent to the display area 210, and only one through-hole 205 may be disposed in each through-hole section 230 away from the display area 210. Two through-holes 205 may be disposed in the middle of each through-hole section 230. The number of through-holes 205 may gradually decrease when the distance to the display area 210 increases.

It should be noted that, the number and the distribution of the through-holes shown in FIGS. 4-6 are for illustrative purposes and is not intended to limit the scope of the present disclosure. In practical applications, the number and the distribution of the through-holes in each through-hole section may be determined according to various application scenarios.

Figure 7:
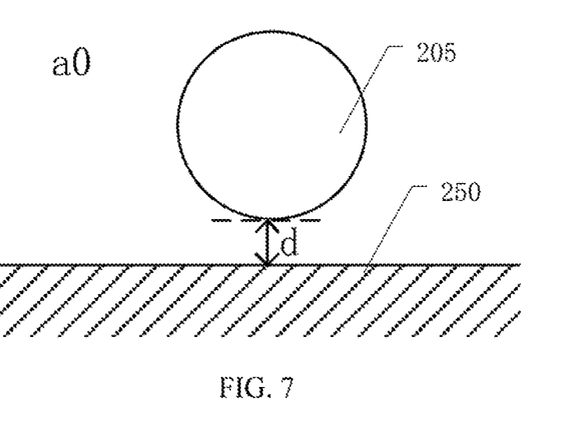
FIG. 7 illustrates an enlarged view of an a0 area in FIG. 4.

In one embodiment, the distance between the through-holes 205 and the bonding section may be greater than or equal to about 1.5 mm. FIG. 7 illustrates an enlarged view of the a0 area in FIG. 4. In particular, as shown in FIG. 7, a through-hole 205 in the through-hole section 230 and adjacent to the bonding section 250 may have a distance d between the through-hole 205 and the bonding section 250. The distance d may be configured to be greater than or equal to about 1.5 mm, thereby avoiding any potential damage to the flexible substrate 200 in the bonding section 250 due to the drilling of the through-holes 205.

Meanwhile, to eliminate the bubbles to the greatest extent, the minimum distance between the through-holes 205 and the bonding section 250 may be configured to be smaller than or equal to about 3 mm to maximize the through-hole distribution to the greatest extent. The minimum distance between the through-holes 205 and the bonding section 250 refers to the distance between the through-hole 205 closest to the bonding section 250 and the bonding section 250. In particular, in the disclosed embodiments, the minimum distance may be smaller than or equal to about 3 mm.

Similarly, to avoid any potential damage to the flexible substrate 200 in the display area 210 due to the drilling of the through-holes 205, the distance between the through-holes 205 and the display area 210 may be configured to be greater than or equal to about 1.5 mm. Meanwhile, to eliminate the bubbles to the greatest extent, the minimum distance between the through-holes 205 and the display area 210 may be configured to be smaller than or equal to about 3 mm.

Referring to FIG. 2 and FIG. 4, the display panel may also include a sealing layer 206 disposed on the top surface of the through-hole sections 230. The sealing layer 206 may be able to block moisture from entering the through-holes 205 in the flexible substrate 200, thereby avoiding any potential damage to the display device 201.

Referring to FIG. 2 and FIG. 4, in the fabrication process of the flexible display panel, the through-holes 205 may be formed before attaching the bottom protective film 204 attached. Thus, after the bottom protective film 204 is attached to the flexible substrate 200, the bubble removal process may be performed to discharge the air trapped in the bubbles. After the bubble removal process is completed, the sealing layer 206 may be formed to seal the through-holes 205 in the through-hole sections 230. In certain embodiments, the sealing layer 206 may only cover the through-hole sections 230. In certain other embodiments, the sealing layer 206 may cover the lead line sections 240 and the bonding section 250 in addition to the through-hole sections 230 to protect the entire flexible display panel.

Further, the display panel may also include a flexible circuit board electrically connected to the lead lines in the bonding section 250. The flexible circuit board may be electrically connected to the lead lines in the bonding section 250 to facilitate signal transmission of the flexible display panel.

In one embodiment, the flexible display panel may be an OLED display panel. In another embodiment, the flexible display panel may be an electrophoretic display panel, a dielectrophoretic display panel or any other appropriate display panels.

In the flexible display panel disclosed by the present disclosure, a plurality of through-holes may be formed in the step area of the flexible substrate and penetrating the flexible substrate. The air trapped in the bubbles generated when attaching the protective film to the bottom surface of the flexible substrate may be discharged through the through-holes in the bubble removal process. Thus, the problem of the presence of the bubbles in the step area in the existing technology may be resolved, the appearance degrading of the flexible display panel and the potential damages to the lead lines caused by the bubbles may be avoided, and the overall quality of the flexible display panel may be improved.

Figure 8:
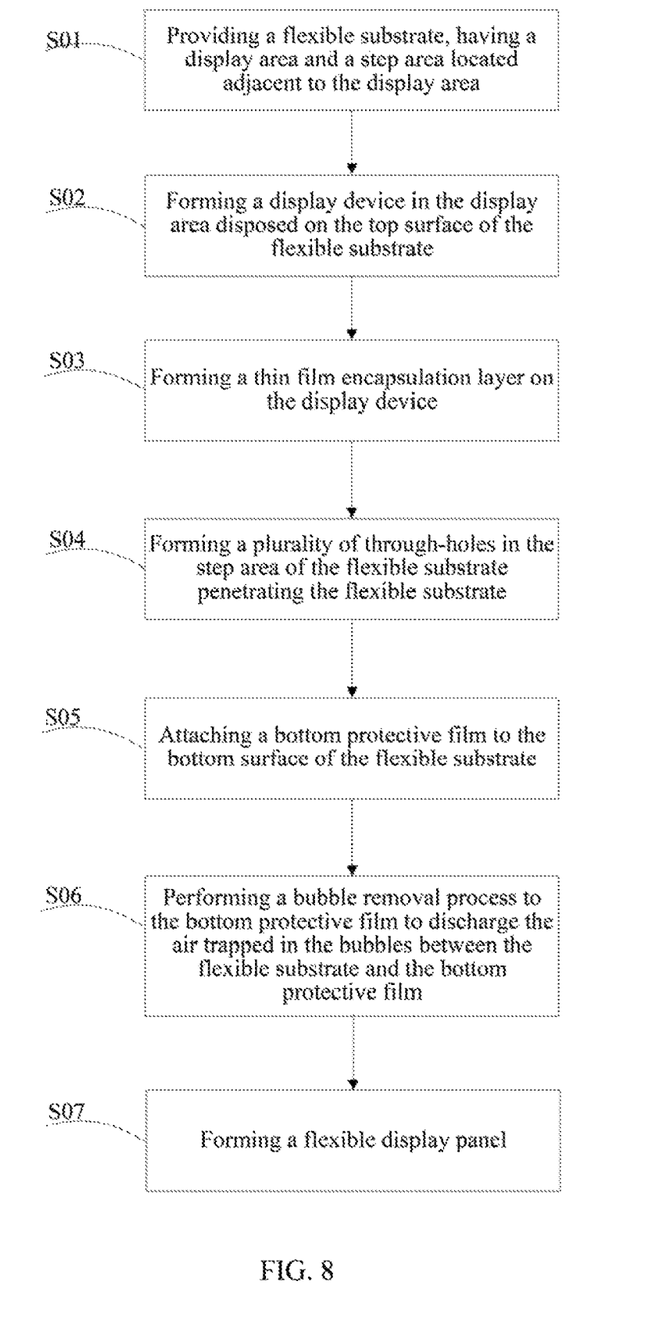
FIG. 8 illustrates a flow chart of an exemplary flexible display panel fabrication method according to the disclosed embodiments.

Accordingly, the present disclosure also provides a fabrication method for the flexible display panel. FIG. 8 illustrates a flow chart of an exemplary fabrication method of the flexible display panel according to the present disclosure. FIGS. 10-14 illustrate cross-sectional views of an exemplary flexible display panel during certain stages of the fabrication method in FIG. 8 according the disclosed embodiments. As shown in FIG. 8, at the beginning, a flexible substrate having a display area and a step area located adjacent to the display area is provided (S01). The corresponding structure is shown in FIG. 9.

Figure 9:
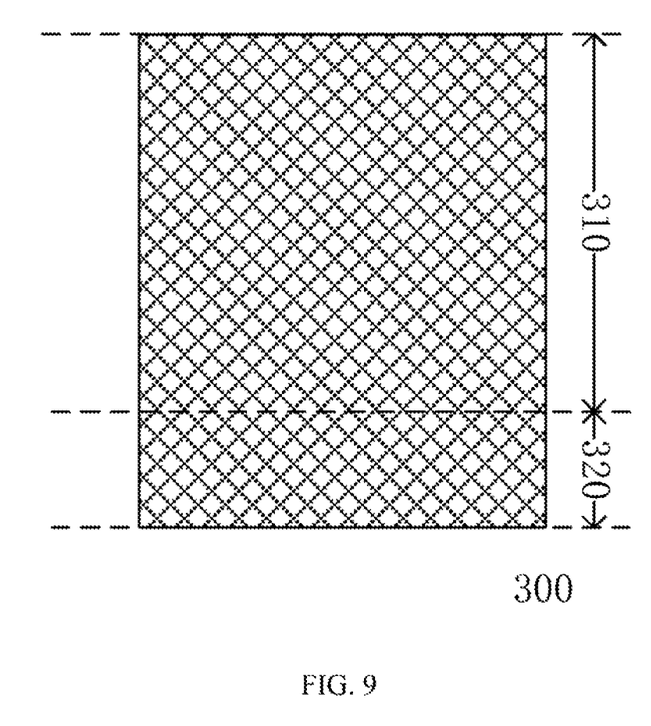
FIG. 9 illustrates a schematic view of an exemplary display panel in step S01 of an exemplary flexible display panel fabrication method in FIG. 8 according to the disclosed embodiments.

As shown in FIG. 9, the flexible substrate 300 may be a plastic substrate, a stainless-steel substrate, an ultra-thin glass substrate, a paper substrate, or a bio-composite film substrate. In one embodiment, the flexible substrate 300 may be the plastic substrate. Specifically, the flexible substrate may be PET film or polyimide (PI) film.

Further, the flexible substrate 300 may include a display area 310 and a step area 320 adjacent to the display area 310. The display area 310 may be configured to dispose a display device, and the step area 320 may be configured to dispose a plurality of lead lines.

In one embodiment, the flexible substrate 300 may include a thin film transistor (TFT) array layer. The TFT array layer may include a plurality of TFTs arranged in array and configured to drive the display device to emit light.

Returning to FIG. 8, after the flexible substrate is provided, a display device is formed in the display area disposed on the top surface of the flexible substrate (S02). The corresponding structure is shown in FIG. 10.

In one embodiment, the flexible display panel may be an OLED display panel. Accordingly, an OLED display device may be formed in the display area disposed on the top surface of the flexible substrate. In another embodiment, the flexible display panel may be an electrophoretic display panel. Accordingly, an electrophoretic display device may be formed in the display area disposed on the top surface of the flexible substrate. Any appropriate display devices may be formed in the display area disposed on the top surface of the flexible substrate, which is not limited by the present disclosure.

Figure 10:
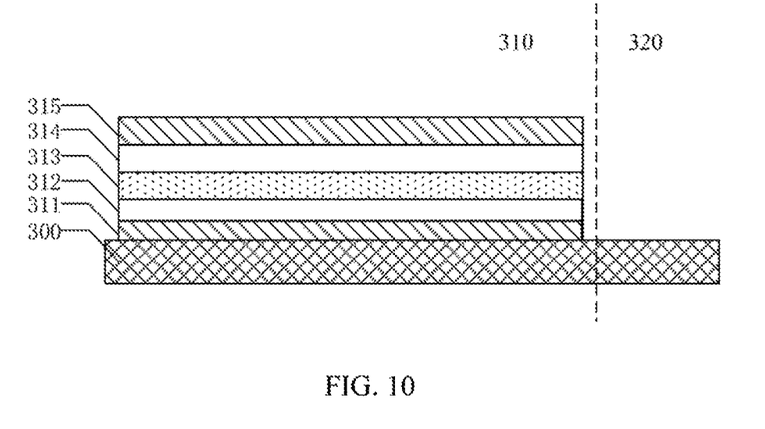
FIG. 10 illustrates a schematic view of an exemplary display panel in step S02 of an exemplary flexible display panel fabrication method in FIG. 8 according to the disclosed embodiments.
Figure 16:
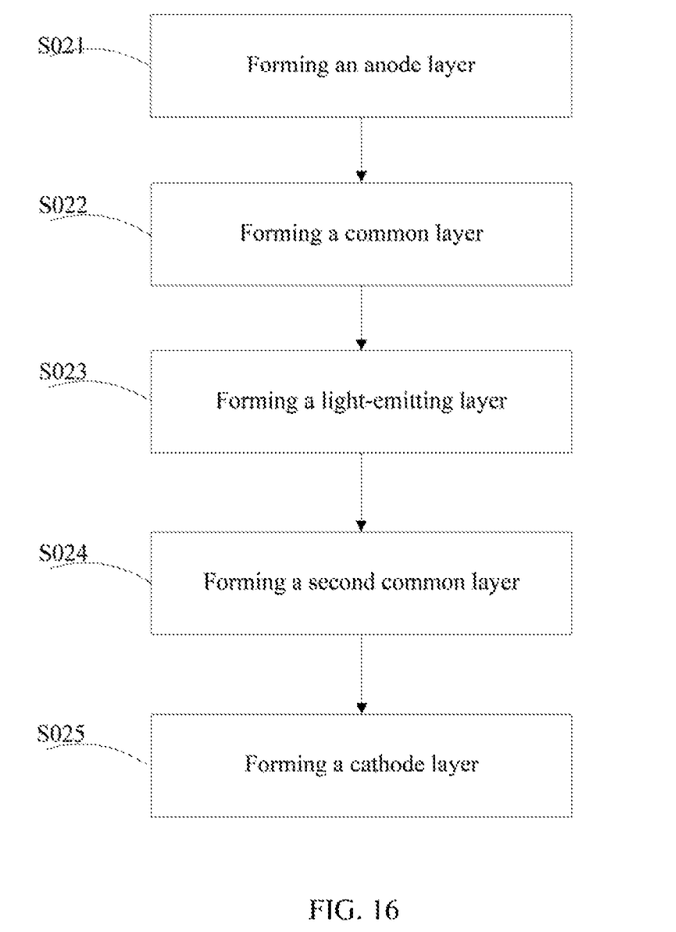
FIG. 16 illustrates a flow chart of step S02 of an exemplary flexible display panel fabrication method in FIG. 8 according to the disclosed embodiments.

As shown in FIG. 10, the display device (e.g., OLED display device) may include an anode layer 311, a first common layer 312, a light-emitting layer 313, a second common layer 314, and a cathode layer 315. FIG. 16 illustrates a flow chart of step S02 of an exemplary flexible display panel fabrication method in FIG. 8 according to the disclosed embodiments.

As shown in FIG. 16, at the beginning, an anode layer is formed (S021). The corresponding structure is shown in FIG. 10. As shown in FIG. 10, an anode layer 311 may be formed on the substrate 300. For example, a conductive layer may be formed as the anode layer 311 by a vapor deposition process. Then, the anode layer 311 may be etched by a photolithographic patterning process.

Returning to FIG. 16, after the anode layer is formed, a common layer is formed (S022). The corresponding structure is shown in FIG. 10. As shown in FIG. 10, the first common layer 312 may be formed on the anode layer 311. The first common layer 312 may include a hole injection layer and a hole transport layer.

For example, the first common layer 312 may be formed by the same vapor deposition process as the anode layer 311. In particular, the hole injection layer may be formed by the vapor deposition process. Then, the hole transport layer may be formed by the vapor deposition process. When forming the first common layer, the hole injection layer and the hole transport layer may be made of different materials.

Returning to FIG. 16, after the common layer is formed, a light-emitting layer is formed (S023). The corresponding structure is shown in FIG. 10. As shown in FIG. 10, the light-emitting layer 313 may include a plurality of light-emitting pixel units. In one embodiment, the light-emitting pixel units may include a plurality of first light-emitting pixel units emitting light of a first color, a plurality of second light-emitting pixel units emitting light of a second color, and a plurality of third light-emitting pixel units emitting light of a third color. When forming the light-emitting layer 313, the first light emitting pixel unit, the second light-emitting pixel unit, and the third light-emitting pixel unit may be made of different materials and may be formed by different masks.

In another embodiment, the light-emitting pixel units may include a plurality of first light-emitting pixel units emitting light of a first color, a plurality of second light-emitting pixel units emitting light of a second color, a plurality of third light-emitting pixel units emitting light of a third color, and a plurality of fourth light-emitting pixel units emitting light of a fourth color. When forming the light-emitting layer 313, the first light emitting pixel unit, the second light-emitting pixel unit, the third light-emitting pixel unit, and the fourth light-emitting pixel unit may be made of different materials and may be formed by different masks.

The three-color and four-color light-emitting pixel units are for illustrative purposes, and is not intended to limit the scope of the present disclosure.

Returning to FIG. 16, after the light-emitting layer is formed, a second common layer is formed (S024). The corresponding structure is shown in FIG. 10. As shown in FIG. 10, the second common layer 314 may include an electron transport layer and an electron injection layer. The second common layer 314 may be formed by the vapor deposition process. In particular, the electron transport layer may be formed by the vapor deposition process. Then, the electron injection layer may be formed by the vapor deposition process. Similarly, when forming the second common layer 312, the electron transport layer and the electron injection layer may be made of different materials.

Returning to FIG. 16, after the second common layer is formed, a cathode layer is formed (S025). The corresponding structure is shown in FIG. 10. As shown in FIG. 10, a conductive layer may be formed as the cathode layer 315 by the vapor deposition process. Then, the cathode layer 315 may be etched by the photolithographic patterning process.

After the multi-layer structure is formed, the display device may often reach a certain height or thickness. Thus, in the subsequent process of attaching the bottom protective film, the display panel may have a larger thickness in the display area 310 than in the step area 320. When the bottom protective film is attached to the bottom surface of the flexible substrate 300, the flexible substrate 300 in the step area 320 may be unlikely to be flattened with the flexible substrate 300 in the display area 310. Thus, bubbles may likely occur, degrading the appearance of the flexible display panel and causing potential damages to the lead lines in the step area 320 of the flexible display panel.

In another embodiment, to ensure a smooth fabrication process of the flexible display panel, the fabrication method may further include the following steps before the display device is formed.

The flexible substrate may be attached to a rigid substrate. The rigid substrate may be bonded to the bottom surface of the flexible substrate. The step of attaching the flexible substrate to the rigid substrate may include depositing a substrate material layer on the bottom surface of the flexible substrate and then curing the substrate material at a high temperature. Other appropriate methods may also be used to attach the flexible substrate to the rigid substrate, which is not limited by the present disclosure. The rigid substrate may be, for example, a glass substrate or a quartz substrate.

By being attached to the rigid substrate, the flexible substrate may be strengthened to support the subsequent steps of the fabrication process, and avoid the potential damages to the flexible display panel due to the bending of the flexible substrate. The rigid substrate may be removed after the subsequent steps of the fabrication steps are completed. In one embodiment, a laser-lift-off (LLO) process may be used to detach the flexible substrate 300 formed with the flexible display device from the rigid substrate. In another embodiment, a removable layer technology, a sacrificial layer removal process, a mechanical peeling process, a chemical peeling process, or other suitable processes may be used to detach the flexible substrate 300 from the rigid substrate, which is not limited by the present disclosure.

Returning to FIG. 8, after the display device is formed on the display area disposed on the top surface of the flexible substrate, a thin film encapsulation layer is formed on the display device (S03). The corresponding structure is shown in FIG. 11.

Figure 11:
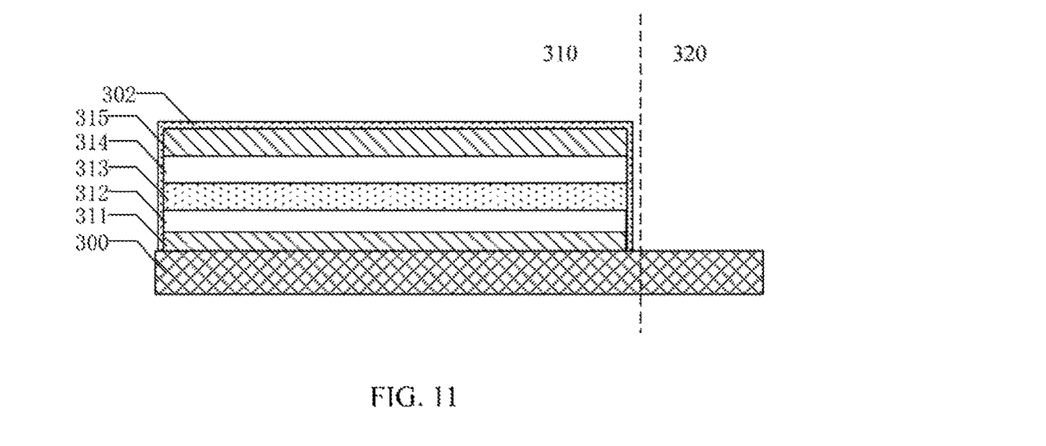
FIG. 11 illustrates a schematic view of an exemplary display panel in step S03 of an exemplary flexible display panel fabrication method in FIG. 8 according to the disclosed embodiments.

As shown in FIG. 11, the thin film encapsulation layer 302 may include an encapsulation thin film to seal and package the display device. The thin film encapsulation layer 302 may cover the entire display device, including the side surfaces of the display device, such that the display device may be completely isolated from moisture and oxygen, and the potential damages to the display device caused by moisture and oxygen may be avoided. The thin film encapsulation layer 302 may be formed by alternately overlapping the vacuum deposition polymer film and the high density dielectric layer, such that the mutual interference between different materials of the protective films can be effectively eliminated.

Further, Step S03 may also include forming a top protective film on the thin film encapsulation layer 302 to further protect the display device from any potential damages due to moisture and oxygen. The top protective film may be a moisture and oxygen blocking barrier film. To protect the entire display device, the top protective film may completely cover the thin film encapsulation layer 302, including the thin film protective layer 302 disposed on the side surfaces of the display device.

Returning to FIG. 8, after the thin film encapsulation layer is formed, a plurality of through-holes is formed in the step area of the flexible substrate and penetrating the flexible substrate (S04). The corresponding structure is shown in FIG. 12.

Figure 12:
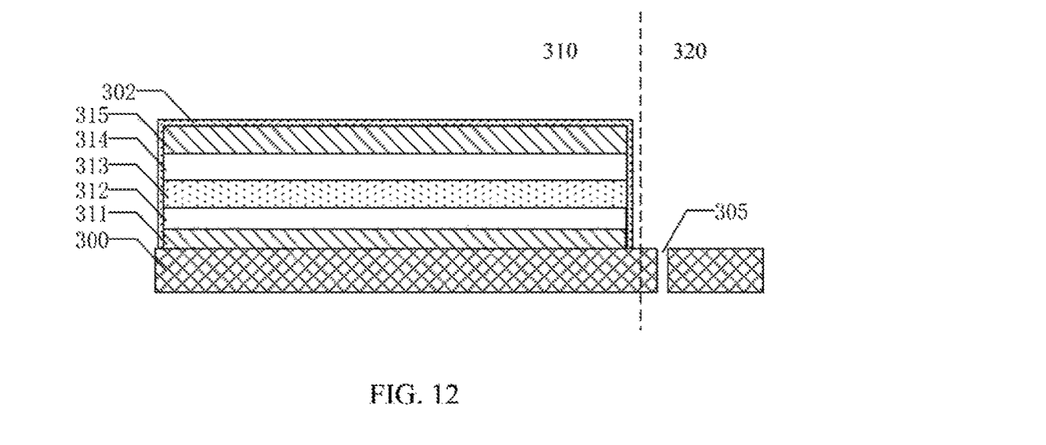
FIG. 12 illustrates a schematic view of an exemplary display panel in step S04 of an exemplary flexible display panel fabrication method in FIG. 8 according to the disclosed embodiments.

As shown in FIG. 12, the through-holes 305 may be formed in the step area 320 of the flexible substrate 300 and penetrating the flexible substrate 300. The through-holes 305 may discharge the air trapped in the bubbles between the flexible substrate 300 and the protective film such that the problem of the presence of the bubbles in the step area 320 of the flexible substrate 300 may be resolved, and the quality and the production yield of the flexible display panel may be improved.

In particular, the through-holes may be formed by a laser drilling process or a laser etching process. The through-holes 305 may have a cross-section in circular, linear, square, oval, or polygonal shape. Further, the through-holes 305 having sharp corners may be likely to cause cracks in the flexible substrate 300. In one embodiment, the though-holes 305 may have a cross-section in circular shape. In practical applications, the through-holes 305 may have a cross-section in other appropriate shapes according to various application scenarios.

Further, the plurality of through-holes 305 may be formed in the step area 320. The through-holes 305 may have any one of the opening sizes smaller than or equal to about 1.5 mm. The opening size of the through-holes 305 may refer to a parameter capable of measuring the opening of the through-holes 305. For example, in the circular through-hole 305, the opening size may be the diameter of the circle. In the oval through-hole 305, the opening size may be the long axis or the minor axis of the ellipse. However, when the though-hole 305 is configured to have the opening size smaller than or equal to about 1.5 mm, the oval through-hole 305 may have both the long axis and the minor axis smaller than or equal to about 1.5 mm.

The reason that the opening size is limited to smaller than or equal to about 1.5 mm may be as follows. When attaching the bottom protective film to the flexible substrate, the generated bubbles may have a maximum diameter of about 5 mm. Given the following thermodynamic formula:

$$\frac{P_1 V_1}{T_1} = \frac{P_2 V_2}{T_2}.$$

In the bubble removal process under 50° C. and about 5 MPa, the bubbles having a diameter of about 5 mm at normal temperature and normal pressure may be split into smaller bubbles having a diameter of about 0.28 times the original diameter (i.e., a diameter of about 1.4 mm). Thus, when the opening size of the through-holes 305 is configured to be smaller than or equal to about 1.5 mm, the damage to the flexible substrate 300 due to the excessive through-hole size may be prevented, while the bubbles may be effectively discharged.

In one embodiment, when the through-holes 305 have the circular cross-section, the diameter of the through-holes 305 may be configured to be smaller than or equal to about 1.5 mm. In another embodiment, the through-holes 305 may have cross-sections in other shapes, such as oval shape. Thus, the long axis of the oval shape may be configured to be smaller than or equal to about 1.5 mm. Similarly, other cross-section shapes may have opening sizes smaller than or equal to about 1.5 mm.

Further, the laser drilling should avoid the lead lines and other metal wiring of the display device. The opening size of the through-holes 305 and the gap between the through-holes 305 may be determined by the circuit layout design, thereby avoiding the potential damages to the lead line circuit wiring due to the drilling.

An exemplary arrangement of the through-holes is shown in FIG. 4. As shown in FIG. 4, the flexible substrate 200 may include a display area 210 and a step area 220. The step area 210 may further include a plurality of through-hole sections 230 for drilling the through-holes 205, a plurality of lead line sections 240 for connecting the display device 201, and a bonding section 250 for bonding the lead lines. The step area 220 may have a first side adjacent to the display area 210 and an opposing side far away from the display area 210. The plurality of the through-hole sections 230 and the plurality of the lead line sections 240 may be disposed alternately along the first side of the step area 220. The bonding section 250 may be disposed on the opposing side of the step area 220. The lead line sections 240 may be connected to the bonding section 250.

During the fabrication of the flexible display panel, the lead lines may be formed before forming the through-holes 205. Through alternately disposing the through-hole sections 230 and the lead line sections 240, the through-holes 205 may be arranged to avoid the lead line positions, and any potential damages to the lead lines due to the drilling of the through-holes 205 may be suppressed. Meanwhile, the alternately disposed through-hole sections 230 and the lead line sections 240 may enable a substantially uniform distribution of the through-holes 205. Thus, the bubbles may be significantly suppressed or even eliminated.

In addition, when the bottom protective film 204 is attached to the flexible substrate 200, the bubbles often occur on the first side of the step area, i.e., the side adjacent to the display area. Thus, through disposing the through-hole sections 230 on the first side of the step area 220, the bubbles may be significantly suppressed or even eliminated. At least one through-hole 205 may be formed in each through-hole section 230. When more than one through-hole 205 are formed in any through-hole section 230, the through-holes 205 may be uniformly distributed in the through-hole section 230.

Because the bubbles between the bottom protective film 204 and the flexible substrate 200 are located in any position, the uniformly distributed through-holes 205 may have a greater probability to hit the bubbles to discharge the air trapped in the bubbles. As a result, the bubbles may be significantly suppressed or even eliminated. In one embodiment, as shown in FIG. 4, two through-holes 205 may be formed uniformly in each through-hole section 230, which is for illustrative purposes and is not intended to limit the scope of the present disclosure.

In another embodiment, the through-holes 205 may be disposed unevenly. The closer to the display area 210, the more likely the bubbles may occur. Thus, in the through-hole sections 230 in the step area 220, more through-holes 205 may be formed closer to the display area 210 and fewer through-holes 205 may be formed further away from the display area 210. That is, more through-holes 205 may be formed at the first side of the step area 220, while fewer through-holes 205 may be formed at the opposing side of the step area 220. Certain examples are shown in FIG. 5 and FIG. 6.

FIG. 5 illustrates a schematic view of an exemplary through-hole distribution in an exemplary flexible display panel according to the disclosed embodiments. As shown in FIG. 5, two through-holes 205 may be disposed in each through-hole section 230 adjacent to the display area 210, and only one through-hole 205 may be disposed in each through-hole section 230 away from the display area 210.

FIG. 6 illustrates a schematic view of another exemplary through-hole distribution in a flexible display panel according to the present disclosure. As shown in FIG. 6, three through-holes 205 may be disposed in each through-hole section 230 adjacent to the display area 210, and only one through-hole 205 may be disposed in each through-hole section 230 away from the display area 210. Two through-holes 205 may be disposed in the middle of each through-hole section 230. The number of through-holes 205 may gradually decrease when the distance to the display area 210 increases.

It should be noted that, the number and the distribution of the through-holes shown in FIGS. 4-6 are for illustrative purposes and is not intended to limit the scope of the present disclosure. In practical applications, the number and the distribution of the through-holes in each through-hole section may be determined according to various application scenarios.

In one embodiment, the distance between the through-holes 205 and the bonding section may be greater than or equal to about 1.5 mm. FIG. 7 illustrates an enlarged view of the a0 area in FIG. 4. In particular, as shown in FIG. 7, a through-hole 205 in the through-hole section 230 and adjacent to the bonding section 250 may have a distance d between the through-hole 205 and the bonding section 250. The distance d may be configured to be greater than or equal to about 1.5 mm, thereby avoiding any potential damage to the flexible substrate 200 in the bonding section 250 due to the drilling of the through-holes 205.

Meanwhile, to eliminate the bubbles to the greatest extent, the minimum distance between the through-holes 205 and the bonding section 250 may be configured to be smaller than or equal to about 3 mm to maximize the through-hole distribution to the greatest extent. The minimum distance between the through-holes 205 and the bonding section 250 refers to the distance between the through-hole 205 closest to the bonding section 250 and the bonding section 250. In particular, in the disclosed embodiments, the minimum distance may be smaller than or equal to about 3 mm.

Similarly, to avoid any potential damage to the flexible substrate 200 in the display area 210 due to the drilling of the through-holes 205, the distance between the through-holes 205 and the display area 210 may be configured to be greater than or equal to about 1.5 mm. Meanwhile, to eliminate the bubbles to the greatest extent, the minimum distance between the through-holes 205 and the display area 210 may be configured to be smaller than or equal to about 3 mm.

In another embodiment, the flexible substrate may be attached to a rigid substrate. Thus, after the through-holes are formed penetrating the flexible substrate, the fabrication method disclosed by the present disclosure may also include removing the rigid substrate.

Returning to FIG. 8, after the plurality of through-holes is formed in the step area of the flexible substrate, a bottom protective film is attached to the bottom surface of the flexible substrate (S05). The corresponding structure is shown in FIG. 13.

Figure 13:
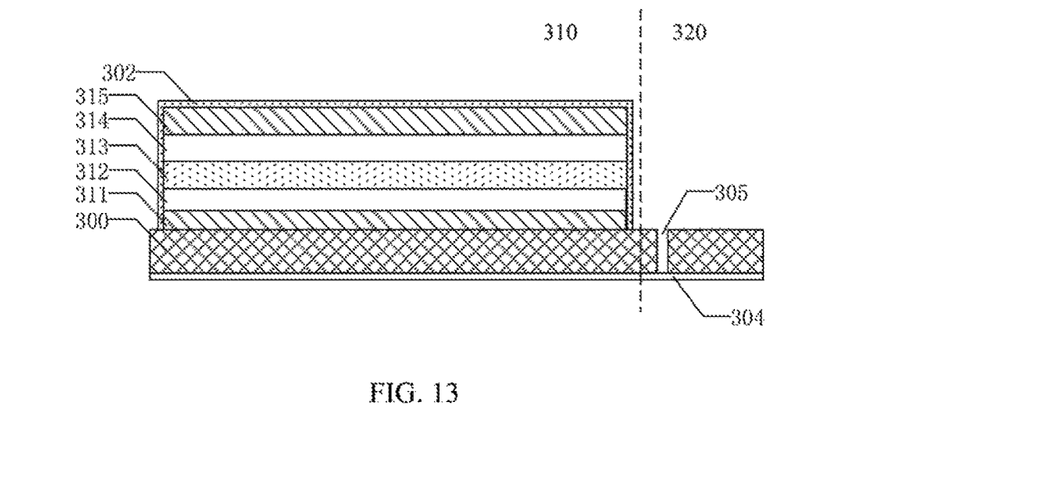
FIG. 13 illustrates a schematic view of an exemplary display panel in step S05 of an exemplary flexible display panel fabrication method in FIG. 8 according to the disclosed embodiments.

As shown in FIG. 13, the bottom protective film 304 may be attached to the bottom surface of the flexible substrate 300. For example, the bottom protective film 304 may be a high temperature resistant polyester film (PET film). To protect the display panel, the bottom protective film 304 may cover the entire bottom surface of the display panel.

The bottom protective film 304 may protect the display device from the moisture and oxygen damages and, meanwhile, protect the flexible substrate 300 of the flexible display panel, enhance the strength of the flexible substrate 300, prevent the flexible substrate in the step area 320 from breaking and damaging the lead lines.

During the fabrication of the flexible display panel, the display device 201 may be often fabricated first, and then the bottom protective film 204 may be attached. Because the display device 201 has a certain height, the display area of the display panel may have a thickness greater than the step area. When attaching the bottom protective film 204 to the bottom surface of the flexible substrate 200, due to the thickness difference between the display area of the display panel and the step area, the step area may not be easily flattened with the display area of the flexible substrate 200. Thus, bubbles are likely to occur in the step area of the flexible substrate 200, degrading the appearance of the flexible display panel.

In one embodiment, because the through-holes 305 are formed on the flexible substrate 300, when forming the bottom protective film, the air trapped in the bubbles located at the positions of the through-holes 305 may be discharged through the through-holes 305 such that the number of the bubbles may be reduced to certain extent.

Returning to FIG. 8, after the bottom protective film is attached to the bottom surface of the flexible substrate, a bubble removal process is performed to the bottom protective film to discharge the air trapped in the bubbles between the flexible substrate and the bottom protective film (S06). The corresponding structure is shown in FIG. 13.

The bubble removal process may be performed at a pressure approximately ranging between 4 MPa and 8 MPa, and at a temperature approximately ranging between 40° C. and 80° C. In one embodiment, the bubble removal process may be performed at the pressure of about 6 MPa, and at the temperature of about 60° C. to force the air trapped in the bubbles to be discharged through the through-holes 305.

Returning to FIG. 8, after the bubble removal process is performed to the bottom protective film to discharge the air trapped in the bubbles between the flexible substrate and the bottom protective film, a flexible display panel is formed (S07). The corresponding structure is shown in FIG. 14.

Figure 14:
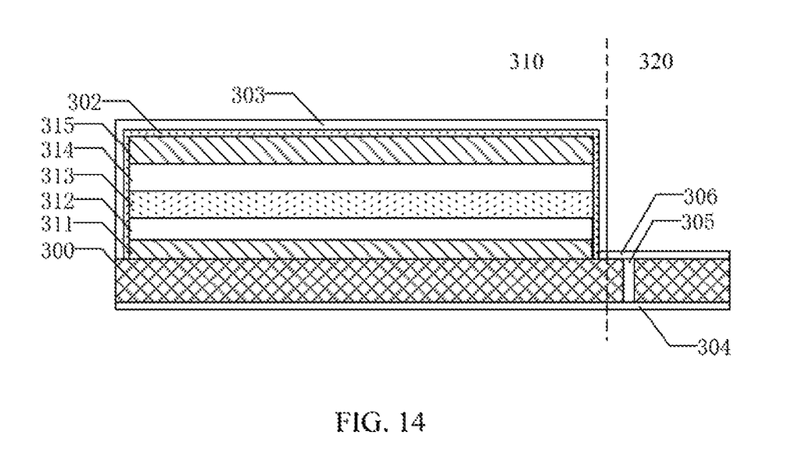
FIG. 14 illustrates a schematic view of an exemplary display panel in step S07 of an exemplary flexible display panel fabrication method in FIG. 8 according to the disclosed embodiments.

As shown in FIG. 14, the lead lines in the step area may be bonded to facilitate signal transmission of the flexible display panel.

A sealing layer 306 may be formed in the step area 320 of the flexible substrate 300 to seal the through-holes 305. In one embodiment, the sealing layer 306 may only cover the through-hole section. In another embodiment, the sealing layer 306 may cover the through-hole section, the lead line section, and the bonding section, simultaneously. The sealing layer 306 may prevent moisture and oxygen from entering the through-holes 305 in the flexible substrate 300, thereby suppressing the moisture and oxygen damages to the device.

In the disclosed fabrication method for the flexible display panel, the through-holes penetrating the flexible display panel may be formed in the step area of the flexible display panel, such that the air trapped in the bubbles, which are generated when attaching the bottom protective film to the bottom of the flexible substrate, may be discharged through the through-holes during the bubble removal process. Thus, the problem of the bubbles in the step area in the existing technology may be resolved, the appearance degrading of the flexible display panel and the potential damages to the lead lines caused by the bubbles may be avoided, and the overall quality of the flexible display panel may be improved.

Figure 15:
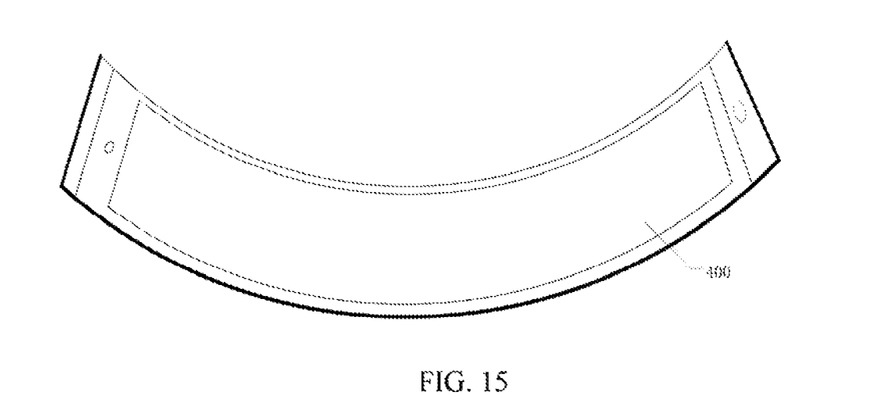
FIG. 15 illustrates a schematic view of an exemplary flexible display apparatus according to the disclosed embodiments.

Accordingly, the present disclosure also provides a flexible display apparatus. FIG. 15 illustrates a schematic view of an exemplary flexible display apparatus according to the disclosed embodiments. As shown in FIG. 15, the flexible display apparatus may include a flexible display panel 400. The flexible display panel 400 may be any one of the disclosed flexible display panels. The flexible display apparatus may be a smart phone, a smart watch, a VR goggle, a smart hand band, an electronic paper, a television set, an automotive display, a notebook computer, a tablet computer, or any flexible display terminal that can be bent, rolled, or folded, which is not limited by the present disclosure.

Because the flexible display apparatus includes the disclosed flexible display panel, the through-holes penetrating the flexible display panel may be formed in the step area of the flexible display panel, such that the air trapped in the bubbles that are generated when attaching the bottom protective film to the bottom of the flexible substrate may be discharged through the through-holes during the bubble removal process. Thus, the problem of the bubbles in the step area in the existing technology may be resolved, the appearance degrading of the flexible display panel and the potential damages to the lead lines caused by the bubbles may be avoided, and the overall quality of the flexible display panel may be improved.

It should be noted that the various embodiments in the present specification are described in a progressive manner. Each embodiment is mainly described in terms of differences from the previously described embodiments. The similarities between different embodiments are not repeated, and may be incorporated by references.

Various embodiments have been described to illustrate the operation principles and exemplary implementations. It should be understood by those skilled in the art that the present invention is not limited to the specific embodiments described herein and that various other obvious changes, rearrangements, and substitutions will occur to those skilled in the art without departing from the scope of the invention. Thus, while the present invention has been described in detail with reference to the above described embodiments, the present invention is not limited to the above described embodiments, but may be embodied in other equivalent forms without departing from the scope of the present invention, which is determined by the appended claims.

What is claimed is:

1. A flexible display panel, comprising:
    a flexible substrate having a display area and a step area adjacent to the display area;
    a display device disposed on a top surface of the flexible substrate and in the display area;
    a bottom protective film disposed on a bottom surface of the flexible substrate; and
    a plurality of through-holes disposed in the step area and penetrating the flexible substrate,
    wherein the step area includes a plurality of through-hole sections for drilling through-holes, a plurality of lead line sections for disposing lead lines of the display device, and a bonding section for bonding the lead lines;
    the step area has a first side adjacent to the display area and an opposing side far away from the display area;
    the plurality of through-hole sections and the plurality of lead line sections are disposed alternately on the first side of the step area;
    the bonding area is disposed on the opposing side of the step area; and
    the plurality of lead line sections are connected to the bonding section.

2. The flexible display panel according to claim 1, wherein:
    a through-hole has a cross-section in a circular or a linear shape.

3. The flexible display panel according to claim 1, wherein:
    a through-hole has an opening size smaller than or equal to about 1.5 mm.

4. The flexible display panel according to claim 1, wherein:
    a through-hole section includes at least one through-hole; and
    when the through-hole section includes more than one through-hole, the more than one through-hole is evenly distributed in the through-hole section.

5. The flexible display panel according to claim 1, wherein:
    a distance between a through-hole and the bonding section is greater than or equal to about 1.5 mm.

6. The flexible display panel according to claim 5, wherein:
    a distance between the through-hole and the display area is greater than or equal to about 1.5 mm.

7. The flexible display panel according to claim 1, further including:
    a sealing layer disposed on a through-hole section,
    wherein the through-hole section has a bottom surface facing the flexible substrate and an opposing surface; and
    the sealing layer is disposed on the opposing surface of the through-hole section.

8. The flexible display panel according to claim 1, further including:
    a flexible circuit board disposed in the bonding section and configured to electrically connect the lead lines in the bonding section.

9. The flexible display panel according to claim 1, further including:
    a thin film encapsulation layer disposed on the display device,
    wherein the display device has a bottom surface facing the flexible substrate and an opposing surface; and
    the thin film encapsulation layer is disposed on the opposing surface of the display device.

10. The flexible display panel according to claim 9, further including:
    a top protective film disposed on the thin film encapsulation layer,
    wherein the thin film encapsulation layer has a bottom surface facing the display device and an opposing surface; and
    the top protective film disposed on the opposing surface of the thin film encapsulation layer.

11. The flexible display panel according to claim 1, wherein:
    the flexible display panel is an organic light-emitting diode display panel or an electrophoretic display panel.

12. A fabrication method for a flexible display panel, comprising:
    providing a flexible substrate having a display area and a step area located adjacent to the display area;
    forming a display device in the display area disposed on a top surface of the flexible substrate;
    forming a thin film encapsulation layer on the display device;
    forming a plurality of through-holes in the step area of the flexible substrate and penetrating the flexible substrate;
    attaching a bottom protective film to a bottom surface of the flexible substrate;
    performing a bubble removal process to discharge air trapped in bubbles between the flexible substrate and the bottom protective film through a through-hole; and
    forming the flexible display panel.

13. The fabrication method according to claim 12, wherein:
    a through-hole has a cross section in a circular or a linear shape; and
    a through-hole has an opening size smaller than or equal to about 1.5 mm.

14. The fabrication method according to claim 13, wherein:
    before forming the display device in the display area disposed on the top surface of the flexible substrate, the fabrication method further includes attaching the flexible substrate to a rigid substrate in contact with the bottom surface of the flexible substrate; and
    after forming the plurality of through-holes in the step area of the flexible substrate and penetrating the flexible substrate while before attaching the bottom protective film to the bottom surface of the flexible substrate, the fabrication method includes removing the rigid substrate.

15. The fabrication method according to claim 12, wherein:

the through-hole penetrating the flexible substrate is formed by laser drilling or laser etching.

16. The fabrication method according to claim 12, further including:

performing the bubble removal process under a pressure approximately between 4 MPa and 8 MPa, and at a temperature approximately between 40° C. and 80° C.

17. The fabrication method according to claim 12, wherein forming the flexible display panel further including:

forming a sealing layer in the step area of the flexible substrate to seal the through-hole.

18. A flexible display apparatus, comprising a flexible display panel, wherein the flexible display panel comprises:

a flexible substrate having a display area and a step area adjacent to the display area;

a display device disposed on a top surface of the flexible substrate and in the display area;

a bottom protective film disposed on a bottom surface of the flexible substrate; and a plurality of through-holes disposed in the step area and penetrating the flexible substrate, and wherein the step area includes a plurality of through-hole sections for drilling through-holes, a plurality of lead line sections for disposing lead lines of the display device, and a bonding section for bonding the lead lines;

the step area has a first side adjacent to the display area and an opposing side far away from the display area;

the plurality of through-hole sections and the plurality of lead line sections are disposed alternately on the first side of the step area;

the bonding area is disposed on the opposing side of the step area; and the plurality of lead line sections are connected to the bonding section.

* * * * *